United States Patent
Maejima et al.

[11] Patent Number: 5,242,543
[45] Date of Patent: Sep. 7, 1993

[54] WET ETCHING METHOD FOR FORMING METAL FILM PATTERN HAVING TAPERED EDGES

[75] Inventors: Taro Maejima; Masahiro Hayama, both of Hyogo, Japan

[73] Assignee: Mitsubishi Denki Kabushiki Kaisha, Tokyo, Japan

[21] Appl. No.: 830,422

[22] Filed: Feb. 4, 1992

[30] Foreign Application Priority Data

Feb. 6, 1991 [JP] Japan ................... 3-15293

[51] Int. Cl.$^5$ ................. C23F 1/00; B44C 1/22
[52] U.S. Cl. .................. 156/659.1; 156/656; 156/664; 252/79.2
[58] Field of Search ............ 156/656, 659.1, 664, 156/665, 666, 643; 252/79.2; 430/313, 318

[56] References Cited

U.S. PATENT DOCUMENTS

| | | | |
|---|---|---|---|
| 3,700,508 | 10/1972 | Keen | 156/656 X |
| 3,825,454 | 7/1974 | Kikuchi et al. | 156/659.1 X |
| 3,935,083 | 1/1976 | Tomozawa et al. | 156/656 X |
| 4,022,930 | 5/1977 | Fraser | 156/656 X |
| 4,082,604 | 4/1978 | Yanez | 156/656 |
| 5,007,984 | 4/1991 | Tsutsumi et al. | 156/659.1 X |

FOREIGN PATENT DOCUMENTS 64-86524  3/1989  Japan .

Primary Examiner—William A. Powell
Attorney, Agent, or Firm—Lowe, Price, LeBlanc & Becker

[57] ABSTRACT

A wet etching method for forming a metal film pattern having tapered edges includes preparing a metal film deposited on a substrate, performing a treatment for making the surface of the metal film hydrophilic, forming a photoresist layer pattern with phenol novolac resin as a main component on the surface of the metal film, post-baking the photoresist layer pattern at a predetermined temperature for a predetermined time and etching the metal film with etchant including nitric acid, thereby obtaining a metal film pattern having edges with a uniform taper angle desirably controlled with precision.

9 Claims, 6 Drawing Sheets

WET ETCHING METHOD FOR FORMING METAL FILM PATTERN HAVING TAPERED EDGES

BACKGROUND OF THE INVENTION

1. Field of the Invention

The present invention relates generally to a wet etching for forming a metal film pattern, and more particularly, to an improvement in etching for forming a metal film pattern (hereinafter referred to as a taper-etching) having tapered edges.

2. Description of the Background Art

FIG. 1 is a flow chart illustrating a conventional wet etching for forming a metal film pattern. As can be seen from the diagram, a metal film is deposited on a substrate of silicon or glass by, for example, sputtering in step S1. In step S2, the metal film is covered by a photoresist layer including phenol novolac as a main component. In step S3, the photoresist is pre-baked. In step S4, predetermined regions of the pre-baked photoresist layer are exposed to light by known photolithography. In step S5, the exposed photoresist layer is developed to have a predetermined pattern. The photoresist pattern is dried in step S6 and fully cured by post-baking at a fixed temperature for a fixed time in step S7. Then in step S8, the metal film covered by the resist pattern is etched to have a predetermined pattern and by a known wet etching method such as a shower method, a spray method and a paddle method with appropriate etchant.

FIG. 2 schematically shows a section of a thin film transistor (TFT). The TFT is commonly used as a drive transistor in a liquid crystal display apparatus. In the TFT, a gate electrode 2a is formed on an insulator substrate 1 of glass or the like by etching a metal film of chromium or tantalum. The gate electrode 2a is covered with a first insulator layer 3 of $SiO_2$ or $Si_3N_4$. An intrinsic type amorphous silicon layer 4 is deposited on the first insulator layer 3. The intrinsic type amorphous silicon layer 4 is covered with a second insulator layer 5 of $Si_3N_4$. An n+ type amorphous silicon layer 6 is deposited on the second insulator layer 5. Source/drain regions of the n type amorphous silicon layer 6 are in contact with the intrinsic type amorphous silicon layer 4 through holes formed in the second insulator layer 5. Source/drain electrodes 7 of aluminum or the like are formed on the source/drain region of the n type amorphous silicon layer 6. The source/drain electrodes 7 are covered with a protective insulator film of $SiO_2$ or the like.

In such TFT as shown in FIG. 2, edges of the second gate electrode 2a are desirably tapered in order to obtain an excellent coverage of upper partial layers in the vicinity of the edge and avoid undesired electric field concentration in the vicinity thereof. The reason is that an improved coverage attributes to prevent disconnection of a lead line, thereby improving a yield rate and that the attenuation of the electric field concentration increases a breakdown voltage of the TFT.

FIGS. 3A, 3B and 3C are sectional views showing the taper etching disclosed in Japanese Patent Laying-Open No. 64-86524. In FIG. 3A, a chromium film 2 is formed on a substrate of silicon or the like by plating or vacuum evaporation, for example. A pattern 10 of photoresist OFPR-77E (product of Tokyo Ohka Corporation) with phenol novolac as a main component is formed on the chromium film 2 by known photolithography.

Thereafter, the chromium film 2 is etched with etchant including ammonium cerium (IV) nitrate of 19 g, nitric acid of 13 cc and water of 87 cc. At this time, the nitric acid included in the etchant starts peeling the edges of the resist layer 10 off from the metal film 2 and the etchant dissolves the chromium film 2 at the same time, as shown in FIG. 3B. As a result, the edges of the patterned chromium film 2a are tapered to have an inclination angle $\theta$ as shown in FIG. 3C.

The taper angle $\theta$ can be controlled by adjusting the temperature and the concentration of the nitric acid of the etchant as shown in FIG. 4. In the graph of FIG. 4, the abscissa represents the concentration of nitric acid (mol/l) and the ordinate represents a taper angle $\theta$ (deg). The curves A, B, C and D respectively show the etching with the etchant temperatures of 22° C., 32° C., 42° C. and 52° C.

Such taper-etching according to the prior art as described above requires the concentration of nitric acid and the temperature of the etchant to be controlled when the thickness of the metal film 2 and the taper angle $\theta$ are changed. In addition, it is difficult to control the taper angle of 20° or less with precision, as can be seen from the graph of FIG. 4. Furthermore, the surface of the metal film 2 is liable to become nonhomogeneous with the passage of time after the deposition thereof, because the surface is partially oxidized or adsorbs moisture. The nonhomogeneous surface of the metal film 2 results in variations of the taper angle $\theta$ depending on the location on the substrate.

SUMMARY OF THE INVENTION

In view of the above described prior art, an object of the present invention is to provide a wet taper-etching enabling a metal film pattern having a desired uniform taper angle to be formed with ease and the taper angle of 20° or less to be controlled with precision.

The taper-etching for forming a metal film pattern having tapered edges according to the present invention includes the steps of preparing a metal film deposited on a substrate, performing a treatment for making the surface of the metal film hydrophilic, forming a photoresist layer pattern with phenol novolac resin as a main component on the surface of the metal film, post-baking the photoresist layer pattern at a predetermined temperature for a predetermined time period and etching the metal film with etchant including nitric acid, thereby obtaining a metal film pattern having edges with a desired uniform taper angle controlled with precision.

The foregoing nd other objects, features, aspects and advantages of the present invention will become more apparent from the following detailed description of the present invention when taken in conjunction with the accompanying drawings.

DESCRIPTION OF THE PREFERRED EMBODIMENTS

Wet taper-etching for forming a metal film pattern according to one embodiment of the present invention will be described with reference to FIGS. 5 and 6A to 6F.

Figure 5:
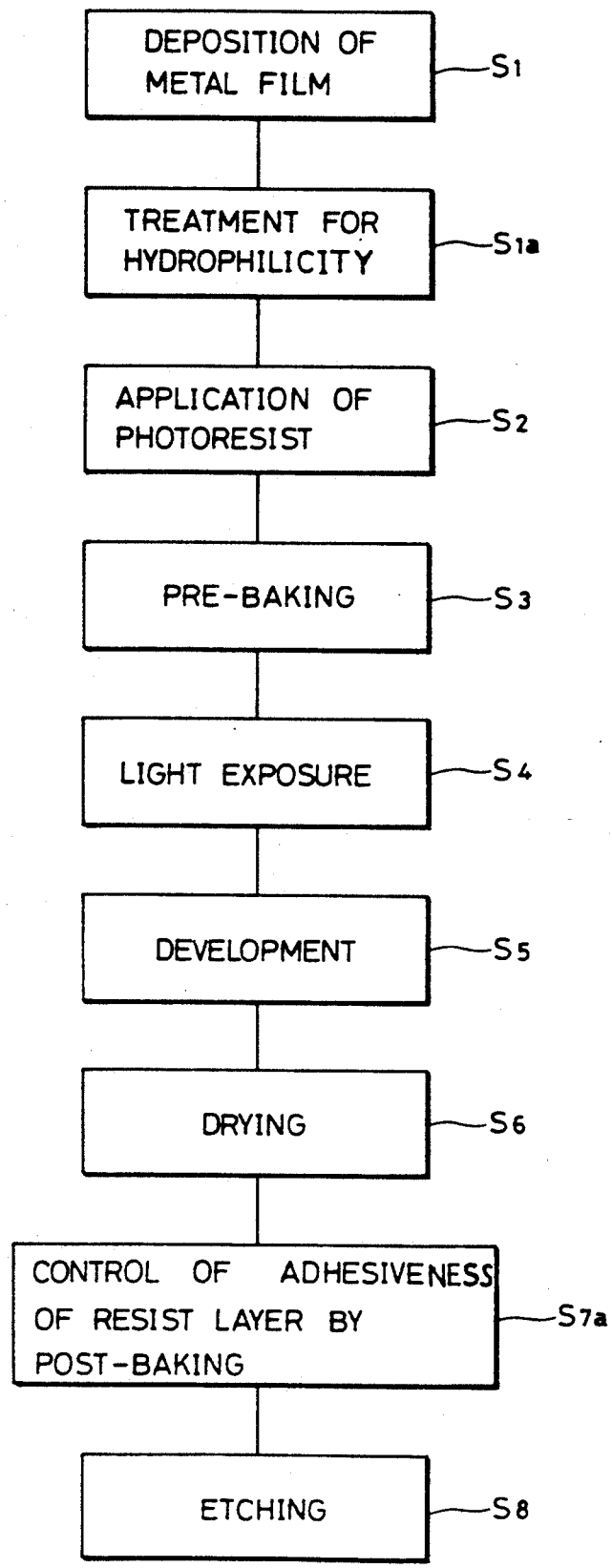
FIG. 5 is a flow chart illustrating an etching method for forming a metal film pattern according to one embodiment of the present invention.
Figure 6A:
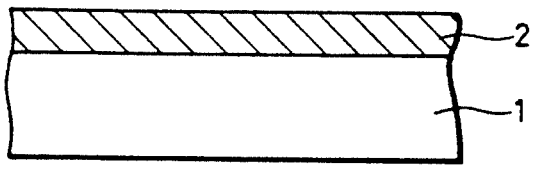
FIGS. 6A to 6F are sectional views illustrating a taper-etching method according to one embodiment of the present invention.

In step S1 of FIG. 5, a metal film 2 of chromium, tantalum, aluminum, copper or titanium is deposited to have a thickness of about 500-5000 Å on a substrate 1 of silicon or glass by sputtering, for example, as shown in FIG. 6A.

Figure 6B:
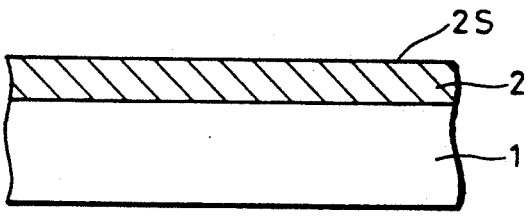

In step S1a, a surface 2s of the metal layer 2 is irradiated by far ultraviolet light having main wave lengths of 185 nm and 254 nm to become hydrophilic as shown in FIG. 6B. The surface 2s of the metal layer 2 can be made hydrophilic also by plasma irradiation and anodic oxidation. The surface 2s of the metal layer 2 becomes homogeneous all over by such treatment for making the surface 2s hydrophilic.

Figure 1:
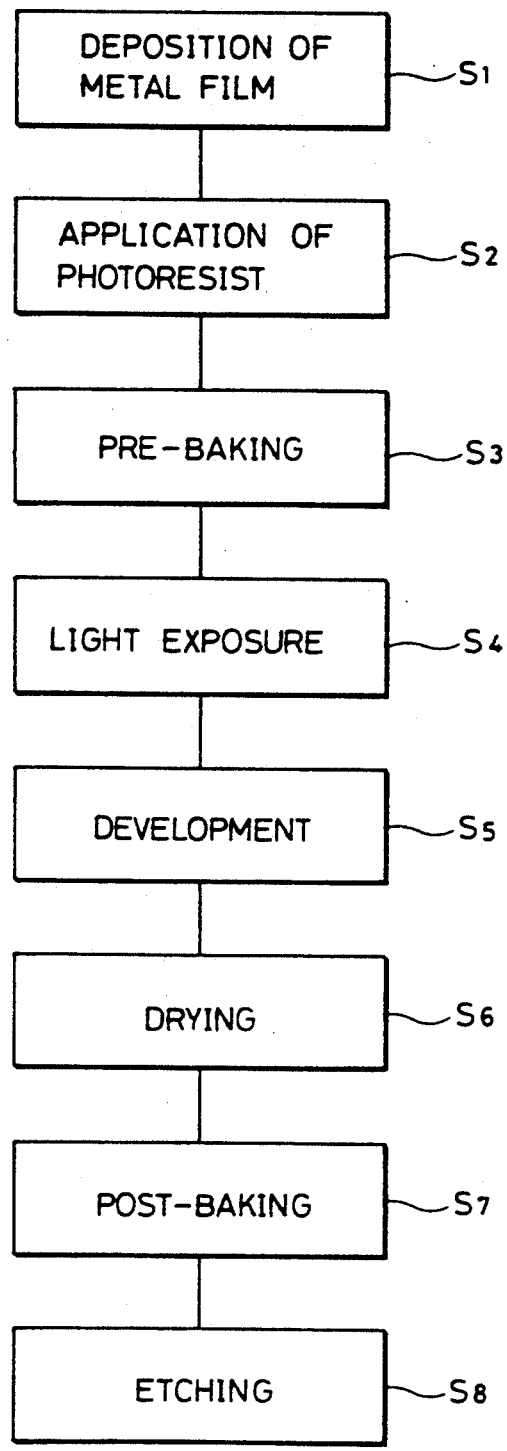
FIG. 1 is a flow chart illustrating a conventional etching method for forming a metal film pattern.
Figure 2:
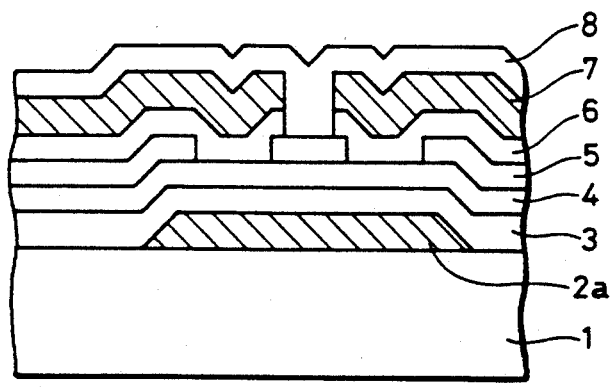
FIG. 2 is a sectional view showing the structure of a typical thin film transistor.
Figure 3A:
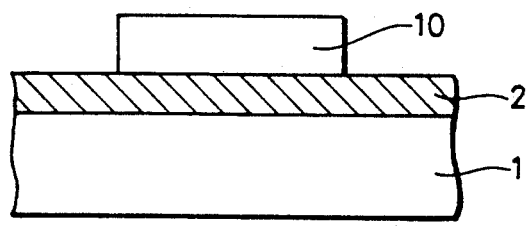
FIGS. 3A, 3B and 3C are sectional views showing a taper etching method according to the prior art.
Figure 3B:
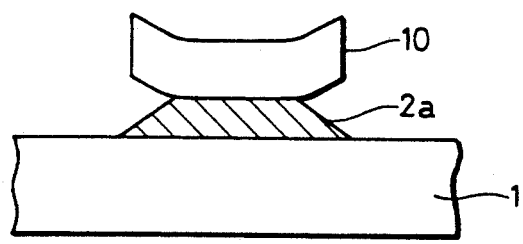
Figure 3C:
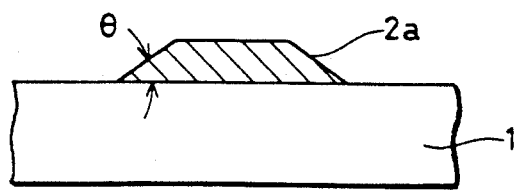
Figure 4:
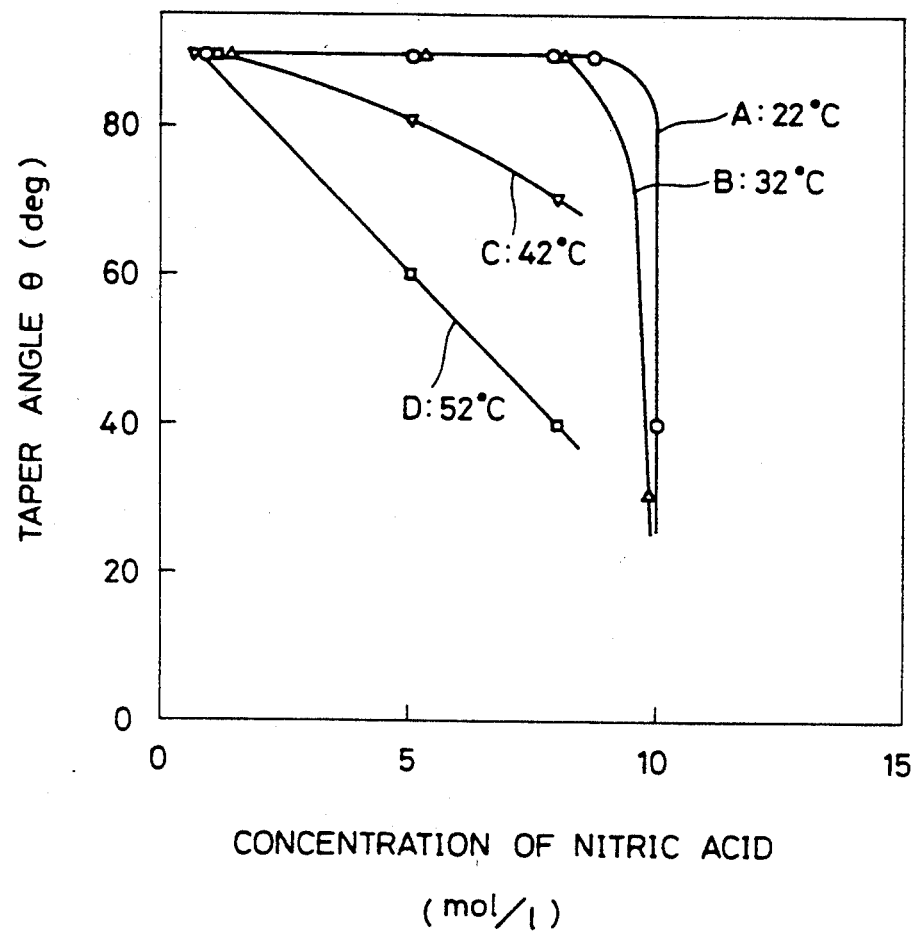
FIG. 4 is a graph showing a dependency of a taper angle on a temperature and a concentration of nitric acid of etchant in the taper-etching method according to the prior art.
Figure 6C:
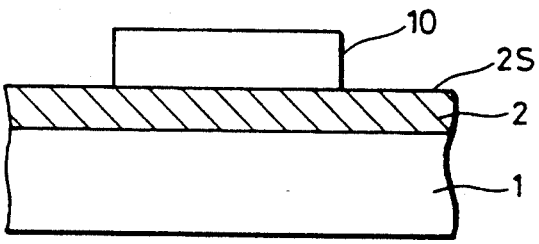

Thereafter, steps S2 to S6 similar to those of the prior art shown in FIG. 1 form a photoresist pattern 10 on the hydrophilic surface 2s of the metal layer 2 as shown in FIG. 6c. The resist layer 10 can be made of resin with phenol novolac as a main component to have a film thickness of about 0.5-3 μm.

Figure 6D:
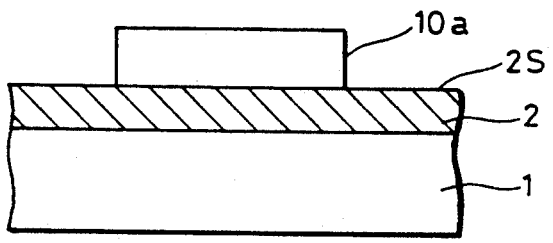

In step S7a, the resist layer 10 is post-baked at a predetermined temperature for a predetermined time period in order to control the adhesiveness between the resist layer 10 and the metal film 2, resulting in a cured resist pattern 10a as shown in FIG. 6D. The post-baking such as convection type or hot plate type heating, is generally performed at about 120° C. within 30 minutes.

Figure 6E:
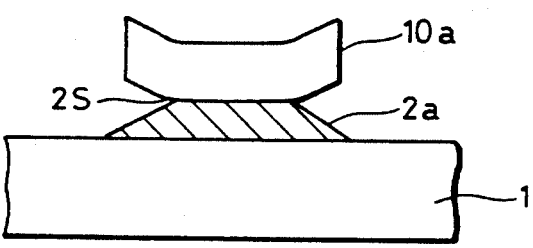

In step S8, as shown in FIG. 6E, the metal film 2 is etched with such etchant including nitric acid of 2 mol/l or more as described in Japanese Patent Laying-Open No. 64-86524. At this time, the liability of the edge portion of the resist film 10a to peel off the metal film 2 under the presence of nitric acid in the etchant depends on the temperature and the time of the above-described post-baking.

Figure 6F:
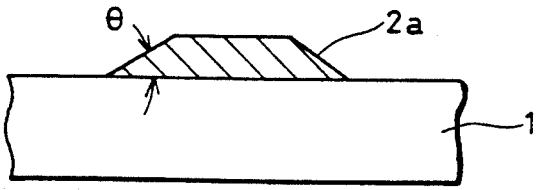

The taper angle θ of the edges of the metal film pattern 2a formed by etching shown in FIG. 6F can be therefore controlled by modifying the post-baking conditions.

Figure 7:
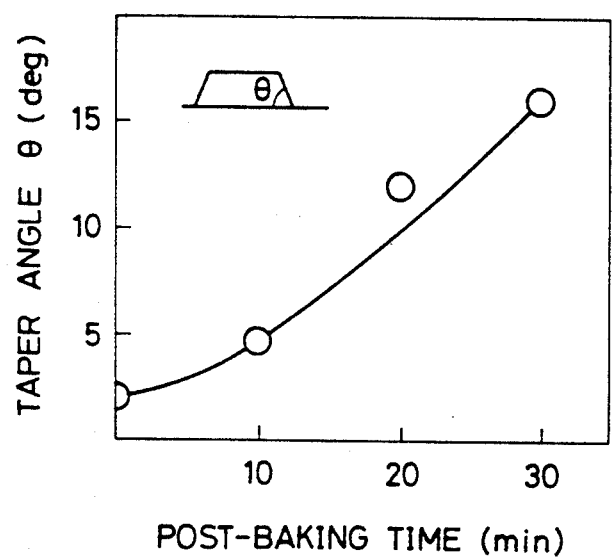
FIG. 7 is a graph showing a relationship between a post-baking time and a taper angle of a resist pattern in a taper-etching method according to one embodiment of the present invention.

FIG. 7 shows a relationship between the post-baking conditions and the taper angle. In the graph of FIG. 7, the abscissa represents a post-baking time (min) and the ordinate represents a taper angle θ (deg), wherein the post-baking temperature is fixed to be 120° C. It can be seen from FIG. 7 that the present invention enables a taper angle of 20° or less to be controlled with precision. The post-baking temperature can be changed within the range from 100° C. to 160° C., and the curve shown in FIG. 7 tends to have a steep inclination with an increase of the temperature.

As described in the foregoing, the treatment for making the surface of the metal film 2 hydrophilic serves to make the surface uniform. It is therefore possible to reduce the variation in the taper angle θ of edges of the formed metal pattern depending on the location, that is, to obtain a uniform taper angle θ.

In addition, controlling the temperature and the time of the post-baking enables a desired taper angle θ of 20° or less to be precisely controlled.

The etching method according to the present invention can be applied to a formation of a gate electrode of a TFT and can provide a TFT having a high breakdown voltage at a high yield rate accordingly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A taper-etching method for forming a chromium film pattern having tapered edges, comprising the steps of:

preparing a chromium film deposited on a substrate, irradiating the surface of said chromium film with far ultraviolet light to make the chromium film surface hydrophilic, forming a photoresist layer pattern with phenol novolac resin as a main component on the surface of said chromium film, post-baking said photoresist layer pattern at a predetermined temperature for a predetermined time period, and etching said chromium film with etchant including nitric acid and ammonium cerium (IV) nitrate in a water solution, thereby obtained a chromium film pattern having edges with a desired uniform taper angle controlled with precision.

2. The taper-etching method according to claim 1, wherein the far ultraviolet light has main wavelengths of 185 nm and 254 nm.

3. The taper-etching method according to claim 1, wherein said etchant includes nitric acid of 2 mol/l or more.

4. The taper-etching method according to claim 1, wherein the chromium film pattern edges have a taper angle of 20° or less.

5. The taper-etching method according to claim 1, wherein said post-baking is carried out within a temperature range from 100° C. to 160° C. up to 30 minutes.

6. The taper-etching method according to claim 1, wherein said substrate is a semiconductor.

7. The taper-etching method according to claim 1, wherein said substrate is an insulator.

8. The taper-etching method according to claim 7, wherein said substrate is a glass plate.

9. A method of manufacturing a thin film transistor, comprising the steps of:

depositing a chromium film on an insulator substrate, irradiating the surface of said chromium film with far ultraviolet light to make the chromium film surface hydrophilic, forming a photoresist layer pattern with phenol novolac resin as a main component on the surface of said chromium film, post-baking said photoresist layer pattern at a predetermined temperature for a predetermined time period, and etching said chromium film with etchant including nitric acid and ammonium cerium (IV) nitrate in a water solution, thereby forming a chromium gate electrode pattern having edges with a desired uniform taper angle controlled with precision.

* * * * *